United States Patent
Hunt et al.

(10) Patent No.: US 9,912,624 B2
(45) Date of Patent: Mar. 6, 2018

(54) LOSSY TEXT SOURCE CODING BY WORD LENGTH

(71) Applicant: International Business Machines Corporation, Armonk, NY (US)

(72) Inventors: Hamish C. Hunt, Ashford (GB); Nicholas K. Lincoln, Middle Wallop (GB); Christopher J. Poole, Romsey (GB); Mark A. Woolley, Winchester (GB)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 14/865,091

(22) Filed: Sep. 25, 2015

(65) Prior Publication Data
US 2017/0093764 A1    Mar. 30, 2017

(51) Int. Cl.
| | |
|---|---|
| *G06F 15/16* | (2006.01) |
| *H04L 12/58* | (2006.01) |
| *G06F 17/30* | (2006.01) |
| *H04L 29/06* | (2006.01) |
| *H03M 7/30* | (2006.01) |

(52) U.S. Cl.
CPC ...... *H04L 51/063* (2013.01); *G06F 17/30153* (2013.01); *H03M 7/30* (2013.01); *H04L 69/04* (2013.01)

(58) Field of Classification Search
CPC ... H04L 29/0604; H04L 51/063; H04L 69/04; H03M 7/30; H04B 1/66; G06F 17/21; G06F 17/22; G06F 17/30153
See application file for complete search history.

(56) References Cited

U.S. PATENT DOCUMENTS

| | | | |
|---|---|---|---|
| 5,590,317 A * | 12/1996 | Iguchi | .............. G06F 17/30011 |
| 6,798,362 B2 | 9/2004 | Modha | |
| 7,728,742 B2 | 6/2010 | Gonion | |
| 7,827,315 B2 | 11/2010 | Kirkland | |
| 2013/0262486 A1 | 10/2013 | O'Dell et al. | |

FOREIGN PATENT DOCUMENTS

| | | |
|---|---|---|
| CN | 1139883 C | 2/2004 |
| CN | 1748369 A | 3/2006 |

OTHER PUBLICATIONS

Al-Dubaee et al., "New Strategy of Lossy Text Compression," First International Conference on Integrated Intelligent Computing, 2010, p. 22-26, IEEE Computer Society.

(Continued)

*Primary Examiner* — Brendan Higa
(74) *Attorney, Agent, or Firm* — Michael O'Keefe

(57) ABSTRACT

According to one embodiment, a method for lossy data compression is provided. The method may include receiving a data message from a sender. The method may also include determining a length and a plurality of bounding characters associated with each data item within the received data message. The method may further include encoding each data item within the received data message by replacing each data item with the determined length and the determined plurality of bounding characters. The method may also include transmitting the received data message to a recipient.

20 Claims, 6 Drawing Sheets

(56) References Cited

OTHER PUBLICATIONS

Bonifati et al., "XML Lossy Text Compression: A Preliminary Study," Database and XML Technologies, 2009, p. 106-113, LNCS 5679, Springer-Verlag.
Cankaya et al., "Exploiting Redundancy to Achieve Lossy Text Compression," Journal of Engineering Sciences, 2010, p. 235-246, vol. 16, Issue 3, Pamukkale University Faculty of Engineering.
Łuczak et al., "A Suboptimal Lossy Date Compression Based on Approximate Pattern Matching," IEEE Transactions on Information Theory, Sep. 1997, p. 1439-1451, vol. 43, No. 5.
Mell et al., "The NIST Definition of Cloud Computing," National Institute of Standards and Technology, Sep. 2011, p. 1-3, Special Publication 800-145.
Norvig, "English Letter Frequency Counts: Mayzner Revisited or ETAOIN SRHLDCU," Peter@Norvig.com Essay, p. 1-8, http://norvig.com/mayzner.html, Accessed on Jul. 8, 2015.
Wikipedia, "Dialog System," Wikipedia: the Free Encyclopedia, Last Modified on Jun. 15, 2015, p. 1-5, https://en.wikipedia.org/wiki/Dialog_system, Accessed on Jul. 8, 2015.

* cited by examiner

US 9,912,624 B2

LOSSY TEXT SOURCE CODING BY WORD LENGTH

FIELD OF INVENTION

The present invention relates generally to the field of computing, and more particularly to data compression.

BACKGROUND

Data compression is a method of storing data that requires less storage space than is typically required. Data compression may involve the encoding of data so that the compression data may use fewer bits than the original representation of the encoded data. Furthermore, data compression may either be lossy or lossless. Lossy compression may reduce bits through identification and removal of unnecessary information. Conversely, lossless compression may reduce bits through identification and elimination of statistical redundancies within the information.

SUMMARY

According to one embodiment, a method for lossy data compression is provided. The method may include receiving a data message from a sender. The method may also include determining a length and a plurality of bounding characters associated with each data item within the received data message. The method may further include encoding each data item within the received data message by replacing each data item with the determined length and the determined plurality of bounding characters. The method may also include transmitting the received data message to a recipient.

According to another embodiment, a computer system for lossy data compression is provided. The computer system may include one or more processors, one or more computer-readable memories, one or more computer-readable tangible storage devices, and program instructions stored on at least one of the one or more storage devices for execution by at least one of the one or more processors via at least one of the one or more memories, whereby the computer system is capable of performing a method. The computer system may include receiving a data message from a sender. The computer system may also include determining a length and a plurality of bounding characters associated with each data item within the received data message. The computer system may further include encoding each data item within the received data message by replacing each data item with the determined length and the determined plurality of bounding characters. The computer system may also include transmitting the received data message to a recipient.

According to yet another embodiment, a computer program product for lossy data compression is provided. The computer program product may include one or more computer-readable storage devices and program instructions stored on at least one of the one or more tangible storage devices, the program instructions executable by a processor. The computer program product may include program instructions to receive a data message from a sender. The computer program product may also include program instructions to determine a length and a plurality of bounding characters associated with each data item within the received data message. The computer program product may further include program instructions to encode each data item within the received data message by replacing each data item with the determined length and the determined plurality of bounding characters. The computer program product may also include program instructions to transmit the received data message to a recipient.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description.

DETAILED DESCRIPTION

Figure 1:
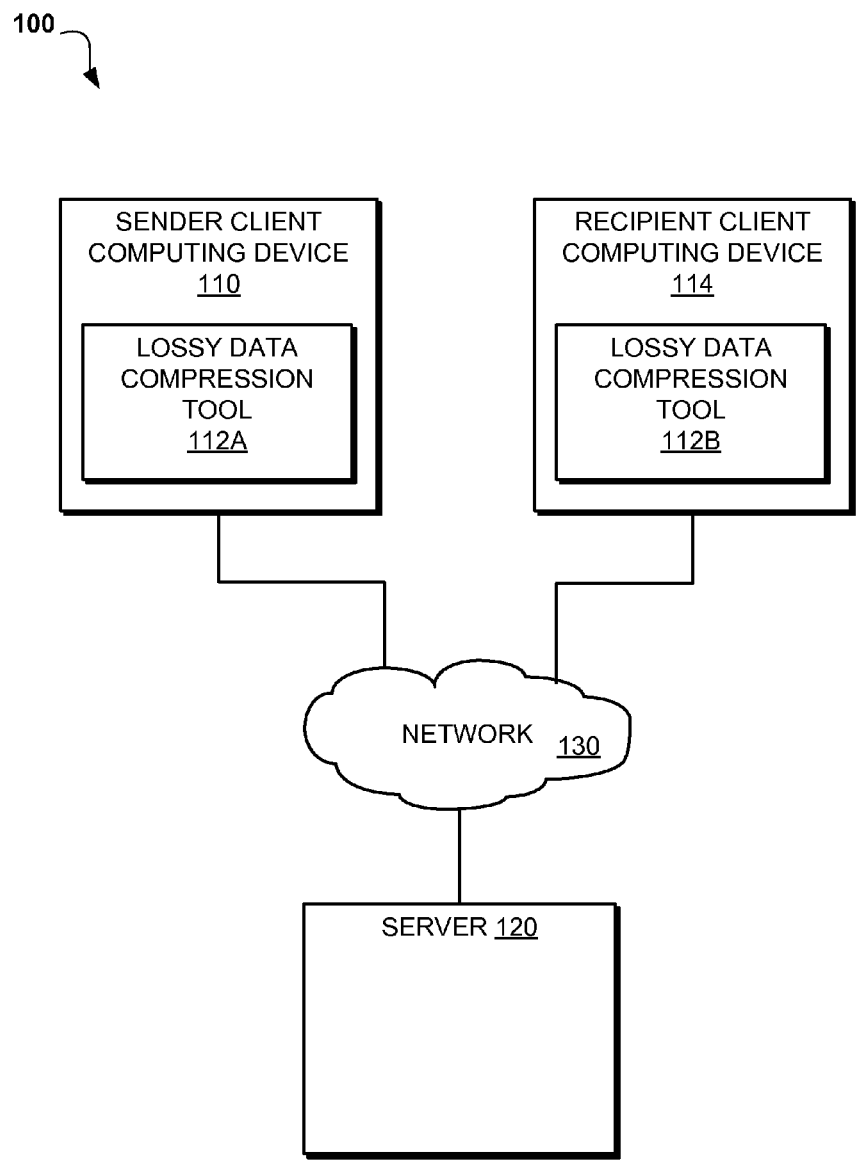
FIG. 1 is an exemplary networked computer environment, in accordance with one embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of the present invention are related to the field of computing, and more particularly to data compression. The following described exemplary embodiments provide a system, method, and program product to, among other things, perform lossy test compression on a source text based on word length. Therefore, the present embodiment has the capacity to improve the technical field of data compression by allowing significant lossy compression of data while retaining a simplistic reconstruction rule.

As previously described, data compression is a method of storing data that requires less storage space than is typically required. Data compression may either be lossy or lossless. Lossy compression may reduce bits through identification and removal of unnecessary information. Conversely, lossless compression may reduce bits through identification and elimination of statistical redundancies within the information. Many data transfer programs, such as chat programs, utilize lossless data compression. Developers may utilize lossless compression with regards to chat programs, such as standalone chat applications, web page chatrooms, and embedded chat environments (i.e. Facebook Chat® (Facebook Chat and all Facebook Chat-based trademarks and logos are trademarks or registered trademarks of Facebook, Inc. and/or its affiliates)), since lossless compression may ensure information is not lost when transmitting natural language text. However, overhead required by many lossless compression algorithms may bloat, rather than compress, data. For example, if text data being transmitted by a chat program is only a few words in length, the overhead may be equal in size, if not larger, than the message being transmitted.

Various lossy compression methods may also be utilized, such as letter mapping, dropped vowels, and replacement of characters. Letter mapping may refer to the swapping of low frequency letters for high frequency letters in a message, which may improve compression by an entropy coder. For example, a low frequency letter, such as "x", may be replaced by a higher frequency letter, such as "e". Replacing low frequency letters with high frequency letters may reduce the encoded alphabet needed when decoding by a recipient. Dropped vowels may refer to a method of removing vowels from a message. For example, the word "racecar" may appear as "rccr" under the dropped vowel method. Since vowels are among the highest frequency characters within messages, vowel removal may reduce the data and the encoded alphabet for the entropy encoder. The replacement of characters may refer to the replacement of groups of characters with a single character. For example, the suffix "est" maybe replaced by the character "e". Therefore, the work "greatest" may appear as "greate" using the replacement of characters method.

Due the complexities of natural language, some lossy compression methods may create semantic misunderstandings when reconstructed by a recipient. For example, the word "greate" encoded using the replacement of characters method may appear as "grestatest" since, when reconstructing the word, the letter "e" may be replaced by the group of characters "est" as was done in reverse when encoding the word. As such, it may be advantageous, among other things, to implement a lossy compression method that utilizes the data length and bounding characters thereby avoiding data bloat encountered in lossless compression and potential semantic misunderstandings resulting from less efficient lossy compression methods. Therefore, greater lossy compression of a data message may result with efficient reconstruction of the encoded message using simple reconstruction rules.

According to one embodiment, length and bounding characters of each data item, such as a word, may be utilized in a lossy compression scheme to encode data. A data message, such as a text message or instant message, may be encoded by representing each data item within the message as a sequence of the bounding characters and data item length. Use of the bounding characters and item length may offer higher compression savings than common compression techniques, such as dropped vowel compression, since more characters may be dropped from the encoded data item. Using the length and bounding characters, original information may be reconstructed using efficient expression engines. Additionally, when the expression engine is unable to reconstruct a data item based on a low probability ranking, the user and/or a dialogue manager may be implemented to train the system and determine the appropriate reconstructed data item.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following described exemplary embodiments provide a system, method, and program product to perform a lossy compression scheme of a data message. According to at least one implementation, a data message may be encoded by analyzing each data item and recording the length of the data item and the bounding characters of the data item, such as the first and last characters. Each data item within the message may be replaced with the recorded bounding characters and item length. Once received by a recipient, the data message may be efficiently decoded using simple reconstruction techniques. Furthermore, the present embodiment may have widespread use in simple messaging applications, such as text messaging applications and instant messaging applications.

Referring to FIG. 1, an exemplary networked computer environment 100 is depicted, in accordance with one embodiment. The networked computer environment 100 may include client computing device 110 and server 120 interconnected via communication network 130. According to at least one implementation, networked computer environment 100 may include a plurality of client computing devices 110 and server 120, only one of each being shown for illustrative brevity.

Communication network 130 may include various types of communication networks, such as a wide area network (WAN), local area network (LAN), a telecommunication network, a wireless network, a public switched network and/or a satellite network. The communications network 130 may include connections, such as wire, wireless communication links, or fiber optic cables. It may be appreciated that FIG. 1 provides only an illustration of one implementation and does not imply any limitations with regard to the environments in which different embodiments may be implemented. Many modifications to the depicted environments may be made based on design and implementation requirements.

Sender client computing device 110 and recipient client computing device 114 may each be, for example, a mobile device, a telephone, a personal digital assistant, a netbook, a laptop computer, a tablet computer, a desktop computer, or any type of computing device capable of running a program and accessing a network. Sender client computing device 110 and recipient client computing device 114 may each be capable of hosting lossy data compression tool 112A, 112B, and communicating with server 120 via network 130, in accordance with one embodiment of the invention. As will be discussed with reference to FIG. 4, sender client computing device 110 and recipient client computing device 114 may each include internal components 402a and external components 404a, respectively.

Server computer 120, or database server, may be a laptop computer, netbook computer, personal computer (PC), a desktop computer, or any programmable electronic device capable of hosting a software program, and communicating with sender client computing device 110 and recipient client computing device 114 via network 130, in accordance with embodiments of the invention. As will be discussed with reference to FIG. 4, server computer 120 may include internal components 402b and external components 404b, respectively. Server 120 may also operate in a cloud computing service model, such as Software as a Service (SaaS), Platform as a Service (PaaS), or Infrastructure as a Service (IaaS). Server 120 may also be located in a cloud computing deployment model, such as a private cloud, community cloud, public cloud, or hybrid cloud.

According to the present embodiment, lossy data compression tool 112A, 112B may be a program capable of encoding a data message by identifying the length and bounding characters of each data item and replacing each data item with the identified length and bounding characters. Lossy data compression tool 112A, 112B may include at least one dictionary of a natural language, such as English or Spanish. In an alternative embodiment, lossy data compression tool 112A, 112B may be capable of connecting to a database that includes at least one dictionary for a natural language. Lossy data compression tool 112A, 112B is explained in further detail below with respect to FIG. 2 and FIG. 3.

Figure 2:
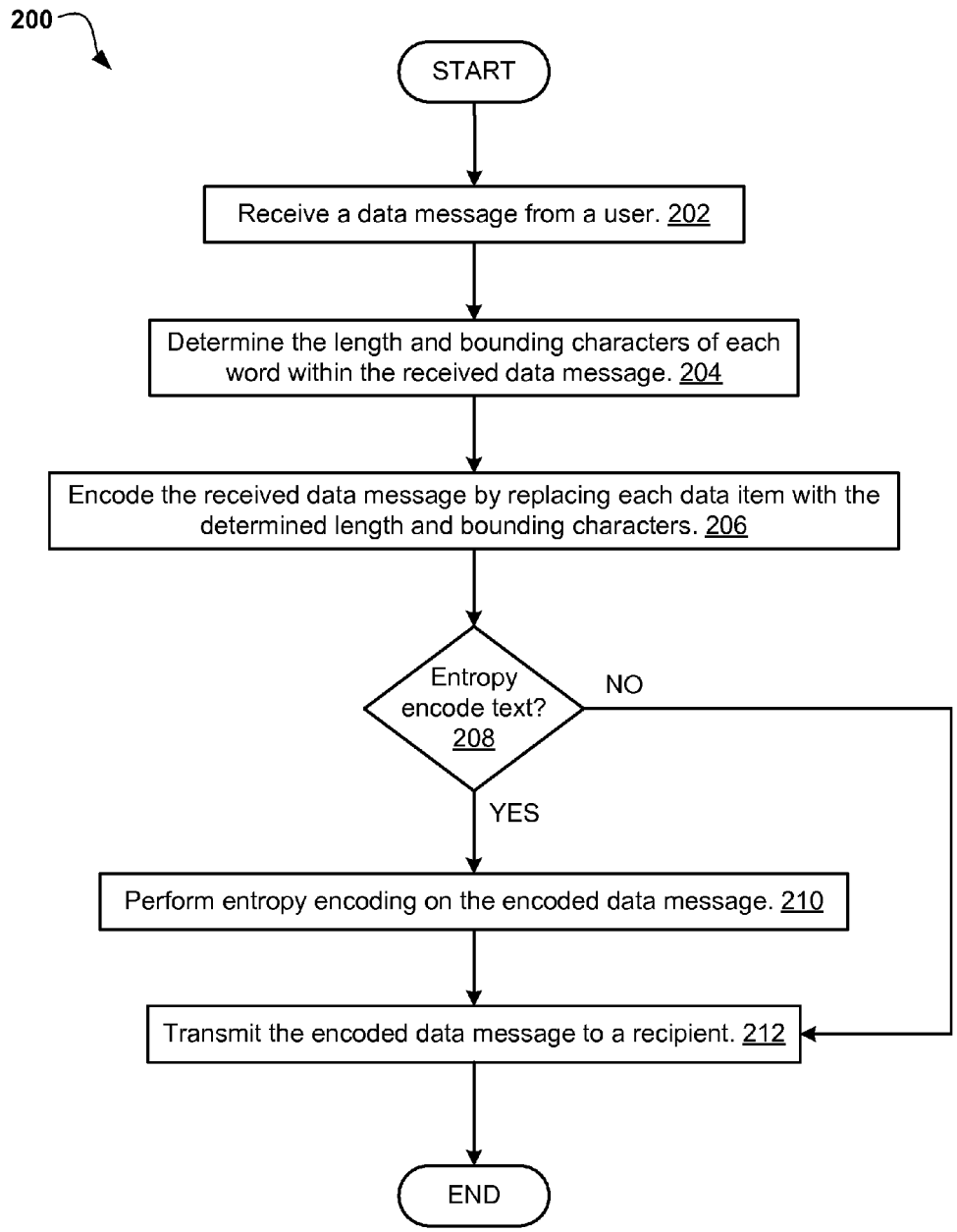
FIG. 2 illustrates a flowchart of the operational steps carried out by a program to encode a data message using lossy data compression on a sender device, in accordance with one embodiment of the present invention.

Referring now to FIG. 2, a flowchart 200 of the operational steps carried out by a program to encode a data message using lossy data compression on a sender device is depicted, in accordance with one embodiment of the present invention. At 202, lossy data compression tool 112A receives a data message from a user. In order to begin the encoding process, lossy data compression tool 112A may require a data message, such as a text message or an instant message, submitted by a user. Lossy data compression tool 112A may receive the data message from a messaging program, such as a text messaging program, an instant messaging program, and an electronic mail program. For example, a first user may send a text message to a second user stating, "The quick brown fox jumps over the lazy dog." Upon the first user sending the text message, the text message may be received by lossy data compression tool 112A.

Next at 204, lossy data compression tool 112A determines the length and bounding characters of each data item within the received data message. A data message may include individual data items, such as words, that have specific identifying characteristics, such as word length and bounding characteristics (i.e. first letter and last letter). Once a data message is received by lossy data compression tool 112A, lossy data compression tool 112A may determine the length, first character, and last character of each data item within the data message. For example, if lossy data compression tool 112A receives the text message "The quick brown fox jumps over the lazy dog", then lossy data compression tool 112A may determine the first word in the data message, "The", has a three letter character length, a first letter of "T", and a last letter of "e". Similarly, lossy data compression tool 112A may determine the second word in the text message, "quick", has a five letter character length, a first letter of "q", and a last letter of "k".

Then at 206, lossy data compression tool 112A encodes the received data message by replacing each data item with the determined length and bounding characters. Once lossy data compression tool 112A has determined the length and bounding characters of each data item, lossy data compression tool 112A may replace each data item within the received data message with the determined length and determined bounding characters. For example, if the received data message is a text message with the phrase "The quick brown fox jumps over the lazy dog", the received data message may be encoded and appear as "3Te5qk5bn3fx5js4or3te41y3dg" by replacing each word of the text message with the length, first letter, and last letter of the corresponding word. Furthermore, when encoding the data message by replacing each data item with the length and bounding characters, the length, first letter, and last letter of the data item may be placed in the encoded data message in a preconfigured order.

In at least one embodiment, lossy data compression tool 112A may encode the received data message with a special character that may not be used elsewhere in the encoded data message, such as the number "0", a carrot symbol, or a tilde. Special characters may be utilized to represent other information in the encoding process that may represent unique identifiers of the encoded data items, such as prefixes and suffixes. The special character may be placed before the bounding characters and the data item length within the encoded data message to indicate that a unique identifiers are present within the original data item. For example, if lossy data compression tool 112A is compressing the word "unemployment", lossy data compression tool 112A may determine the prefix "un-" is a unique identifier that should be represented in the encoded data message. Therefore, lossy data compression tool 112A may include the special character "0" when encoding the word "unemployment". Therefore, the word "unemployment" may be encoded to appear as "012ut".

Next at 208, lossy data compression tool 112A determines whether entropy encoding should be performed on the encoded data message. According to one implementation, the method may continue along operational flowchart 200, if entropy encoding should be performed. If lossy data compression tool 112A determines entropy encoding will be performed (step 208, "YES" branch), lossy data compression tool 112A may continue to step 210 to perform entropy encoding of the encoded data message. If lossy data compression tool 112A determines entropy encoding will not be performed (step 208, "NO" branch), lossy data compression tool 112A may continue to step 212 to transmit the encoded data message to a recipient. Furthermore, lossy data compression tool 112A may determine whether to perform entropy encoding based on a preconfigured setting established by a user or based on letter distribution within the encoded data message.

Then at 210, lossy data compression tool 112A performs entropy encoding of the encoded data message. Entropy encoding may refer to a lossless compression scheme where data is compressed by replacing fixed-length bit sequences representing input symbols with other variable-length bit sequences representing those symbols that may reduce the size of the encoded data, such as Huffman coding or arithmetic coding. In natural language, the frequency of distribution of different letters may not be uniform. Therefore, encoding high frequency letters in a data message with fewer bits and lower frequency letters in a data message with more bits may result in more efficient encoding using fewer bits and maintaining a one-to-one mapping of the bit sequences to letters. For example, in the message "Peter Piper picked a peck of pickled peppers", the letter "p" appears very frequently and the letter "a" only appears once. Therefore, each letter "p" will be encoded with a shorter bit sequence than the letter "a".

Next at 212, lossy data compression tool 112A transmits the encoded data message to a recipient device, such as recipient client computing device 114. Once encoded, the data message may be transmitted by lossy data compression tool 112A to a recipient device so that the encoded data message may be decoded by lossy data compression tool 112B on the recipient device.

In an alternative embodiment, during the transmission of the encoded data message, lossy data compression tool 112A on client computing device 110 may establish a handshake with lossy data compression tool 112B on client computing device 114. In computing, a handshake may be a dynamic process between two entities where a negotiation of system parameters are set. During a handshake between lossy data compression tool 112A and lossy data compression tool 112B conversation parameters may be established, such as the language dictionary and version of the language dictionary being used. For example, during a handshake between lossy data compression tool 112A and lossy data compression tool 112B, the language dictionary may be set as English version 1.09. Therefore, lossy data compression tool 112B may determine that the English version 1.09 dictionary should be utilized when decoding the transmitted data message. Furthermore, the handshake between lossy data compression tool 112A and lossy data compression tool 112B establishing system parameters may be updated at various intervals, such as daily, weekly, monthly, at the beginning of each conversation exchange, or upon the transmission of each data message.

Figure 3:
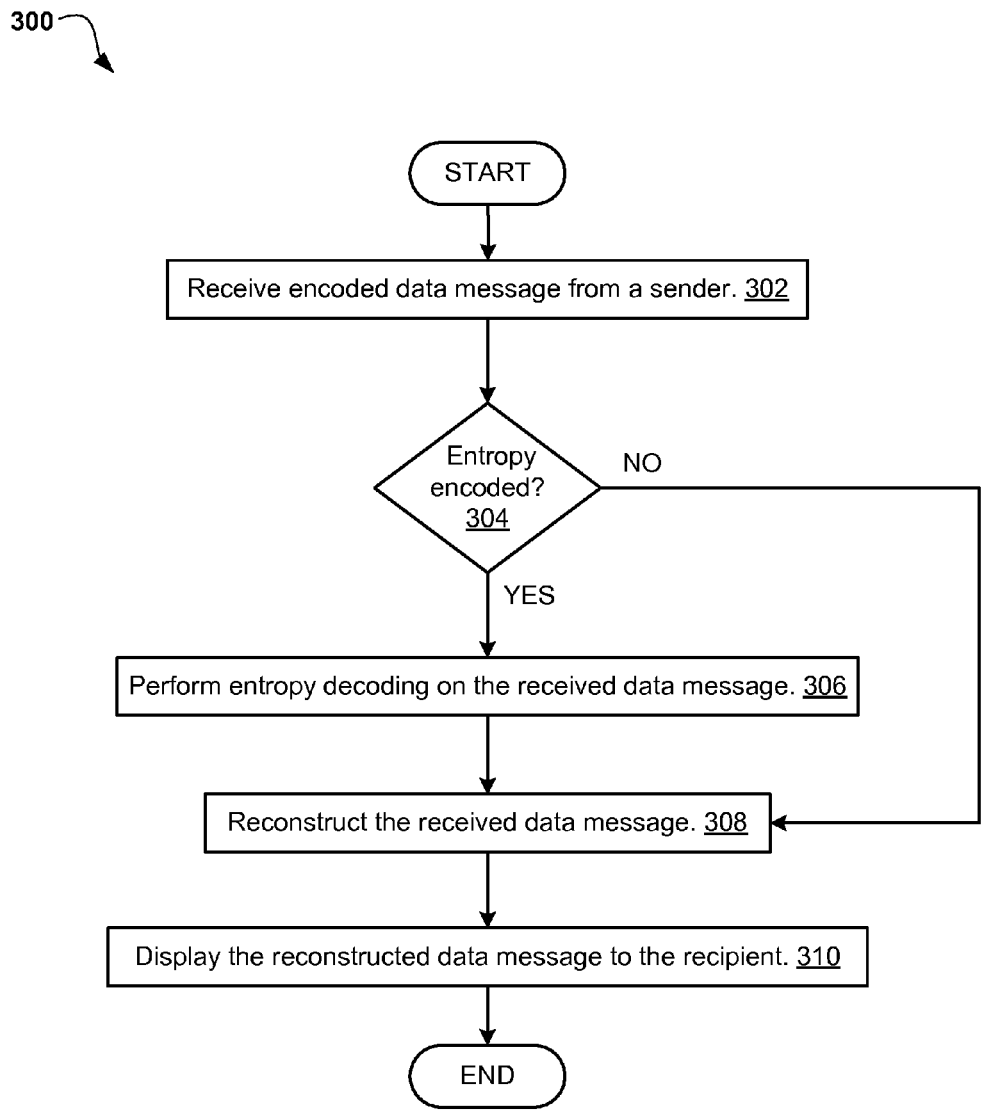
FIG. 3 illustrates a flowchart of the operational steps carried out by a program to decode a lossy compressed data message on a recipient device, in accordance with one embodiment of the present invention.

Referring now to FIG. 3, a flowchart 300 of the operational steps carried out by a program to decode a lossy compressed data message on a recipient device is depicted, in accordance with one embodiment of the present invention. At 302, lossy data compression tool 112B receives an encoded data message from a sender. When a sender transmits an encoded data message to a recipient, the transmitted data message may be received by lossy data compression tool 112B in client computing device 114.

Next at 304, lossy data compression tool 112B determines whether the received data message is entropy encoded. According to one implementation, the method may continue along operational flowchart 300, if the received data message is entropy encoded. If lossy data compression tool 112B determines the received data message is entropy encoded (step 304, "YES" branch), lossy data compression tool 112B may continue to step 306 to perform entropy decoding of the received data message. If lossy data compression tool 112B determines the received data message is not entropy encoded (step 304, "NO" branch), lossy data compression tool 112B may continue to step 308 to reconstruct the received data message.

Then at 306, lossy data compression tool 112B performs entropy decoding on the received data message. If lossy data compression tool 112B determines that a received data message should be entropy decoded, lossy data compression tool 112B may proceed to decode the received entropy encoded data message. As previously described, entropy encoding may refer to a lossless compression scheme where data is compressed by replacing fixed-length bit sequences representing input symbols with other variable-length bit sequences representing those symbols that may reduce the size of the encoded data, such as Huffman coding or arithmetic coding. Therefore, entropy decoding may replace lower frequency data items using more bits and higher frequency data using fewer bits. For example, in the message "Peter Piper picked a peck of pickled peppers", the letter "p" appears very frequently and the letter "a" only appears once. Therefore, each letter "p" will be encoded with a shorter bit sequence than the letter "a". In order to decode the message, lossy data compression tool 112B may map the corresponding bit sequences to their symbols, such as the variable-length bit sequence for the letter "a" being mapped to its original fixed-length bit sequence.

Next at 308, lossy data compression tool 112B reconstructs the received data message. In order for a recipient user to be able to understand a received data message, lossy data compression tool 112B may need to reconstruct the original data message input by the sending user. Using the bounding characters in combination with the data item length, lossy data compression tool 112B may first parse through each encoded data item within the encoded data message to create a list of unencoded candidate data items that the encoded data item may represent. The list of unencoded candidate data items may be selected from a dictionary within or connected to lossy data compression tool 112B. Additionally, lossy data compression tool 112B may assign a probability ranking to each unencoded candidate data item based on natural language and user tendencies. Lossy data compression tool 112B may utilize a dialogue system to improve the probability calculations of each list of unencoded candidate data items by accounting for the conversation context, grammar, and semantics of the data message. Furthermore, lossy data compression tool 112B may utilize a dialogue manager, which may be a sub-component of a dialogue system. Lossy data compression tool 112B may present each list of unencoded candidate data items to the receiving user for selection of the correct data item. Furthermore, lossy data compression tool 112B may order each list of unencoded candidate data items from highest probability candidate to lowest probability candidate. Since candidate probabilities may be affected by user selections on other lists of unencoded candidate data items, lossy data compression tool 112B may recalculate each probability within a list of unencoded candidate data items after a receiving user selects a correct data item on another list of unencoded candidate data items.

In another embodiment, lossy data compression tool 112B may utilize natural language algorithms to analyze each list of unencoded candidate data items to select the specific data item that has the highest probability of being the original data item input by the sending user. Due to the characteristics of natural language, some lists of unencoded candidate data items may include only one data item. For example, if lossy data compression tool 112B identifies a word with the first bounding character as the letter "f", the last bounding as the letter "x", and the length as three characters, the list of candidate data items may only contain the word "fox". Lossy data compression tool 112B may start reconstructing data items within an encoded data message that have shorter lists of candidate data items since lossy data compression tool 112B may have a higher probability of accurately selecting the correct data item from shorter lists of unencoded candidate data items. Furthermore, lossy data compression tool 112B may utilize reconstructed data items within a partially reconstructed data message to assist in identifying the correct data item on a list of candidate data items. For example, if lossy data compression tool 112B identifies a word with the first bounding character as the letter "b", the last bounding as the letter "n", the word length as five characters, the preceding reconstructed word is "quick", and the succeeding reconstructed word is "fox", lossy data compression tool 112B may determine, through a dictionary and natural language characteristics, that the original word input by a sender is the word "brown".

In yet another embodiment of the present invention, lossy data compression tool 112B may implement a hybrid analysis approach of natural language algorithms as well and user selection to reconstruct a data message. Through continued use, lossy data compression tool 112B may determine user word patterns to aid in the reconstruction of data messages.

Then at 310, lossy data compression tool 112B displays the reconstructed data message to a recipient user. Once the original data message has been reconstructed, lossy data compression tool 112B may display the reconstructed data message to the recipient user via a display screen for the recipient user to view and, if necessary, respond to the reconstructed data message.

It may be appreciated that FIG. 2 and FIG. 3 provide only an illustration of one implementation and does not imply any limitations with regard to how different embodiments may be implemented. Many modifications to the depicted environments may be made based on design and implementation requirements. For example, lossy data compression tool 112A, 112B may be implemented to compress structured documents as extensible markup language (XML). Careful design of such documents to include limited vocabulary and syntax may result in extremely efficient message reconstruction.

Figure 4:
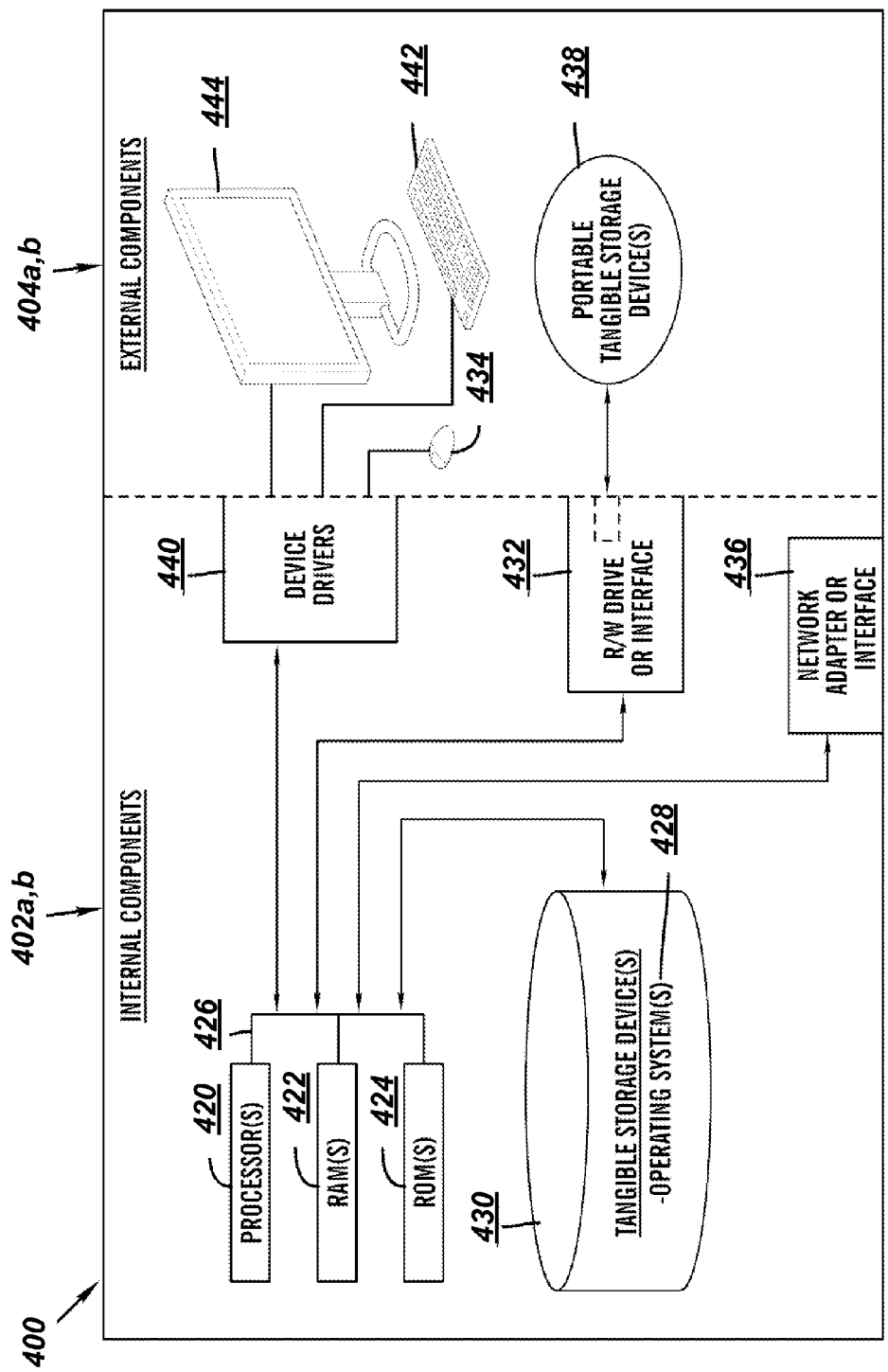
FIG. 4 is a block diagram of internal and external components of computers and servers depicted in FIG. 1 according to at least one embodiment.

FIG. 4 is a block diagram 400 of internal and external components of sender client computing device 110, recipient client computing device 114, and server 120 depicted in FIG. 1 in accordance with an embodiment of the present invention. It should be appreciated that FIG. 4 provides only an illustration of one implementation and does not imply any limitations with regard to the environments in which different embodiments may be implemented. Many modifications to the depicted environments may be made based on design and implementation requirements.

Data processing system 402, 404 is representative of any electronic device capable of executing machine-readable program instructions. Data processing system 402, 404 may be representative of a smart phone, a computer system, PDA, or other electronic devices. Examples of computing systems, environments, and/or configurations that may represented by data processing system 402, 404 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

Sender client computing device 110, recipient client computing device 114, and server 120 may include respective sets of internal components 402 a,b and external components 404 a,b illustrated in FIG. 4. Each of the sets of internal components 402 include one or more processors 420, one or more computer-readable RAMs 422 and one or more computer-readable ROMs 424 on one or more buses 426, and one or more operating systems 428 and one or more computer-readable tangible storage devices 430. The one or more operating systems 428, lossy data compression tool 112A in sender client computer 110; and lossy data compression tool 112B in recipient client computer 114 are stored on one or more of the respective computer-readable tangible storage devices 430 for execution by one or more of the respective processors 420 via one or more of the respective RAMs 422 (which typically include cache memory). In the embodiment illustrated in FIG. 4, each of the computer-readable tangible storage devices 430 is a magnetic disk storage device of an internal hard drive. Alternatively, each of the computer-readable tangible storage devices 430 is a semiconductor storage device such as ROM 424, EPROM, flash memory or any other computer-readable tangible storage device that can store a computer program and digital information.

Each set of internal components 402 a,b also includes a R/W drive or interface 432 to read from and write to one or more portable computer-readable tangible storage devices 438 such as a CD-ROM, DVD, memory stick, magnetic tape, magnetic disk, optical disk or semiconductor storage device. A software program, such as lossy data compression tool 112A, 112B, can be stored on one or more of the respective portable computer-readable tangible storage devices 438, read via the respective R/W drive or interface 432 and loaded into the respective hard drive 430.

Each set of internal components 402 a,b also includes network adapters or interfaces 436 such as a TCP/IP adapter cards, wireless Wi-Fi interface cards, or 3G or 4G wireless interface cards or other wired or wireless communication links. Lossy data compression tool 112A in sender client computer 110 and lossy data compression tool 112B in recipient client computer 114 can be downloaded to sender client computer 110 and recipient client computer 114 from an external computer via a network (for example, the Internet, a local area network or other, wide area network) and respective network adapters or interfaces 436. From the network adapters or interfaces 436, lossy data compression tool 112A in sender client computer 110 and lossy data compression tool 112B in recipient client computer 114 are loaded into the respective hard drive 430. The network may comprise copper wires, optical fibers, wireless transmission, routers, firewalls, switches, gateway computers and/or edge servers.

Each of the sets of external components 404 a,b can include a computer display monitor 444, a keyboard 442, and a computer mouse 434. External components 404 a,b can also include touch screens, virtual keyboards, touch pads, pointing devices, and other human interface devices. Each of the sets of internal components 402 a,b also includes device drivers 440 to interface to computer display monitor 444, keyboard 442, and computer mouse 434. The device drivers 440, R/W drive or interface 432 and network adapter or interface 436 comprise hardware and software (stored in storage device 430 and/or ROM 424).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
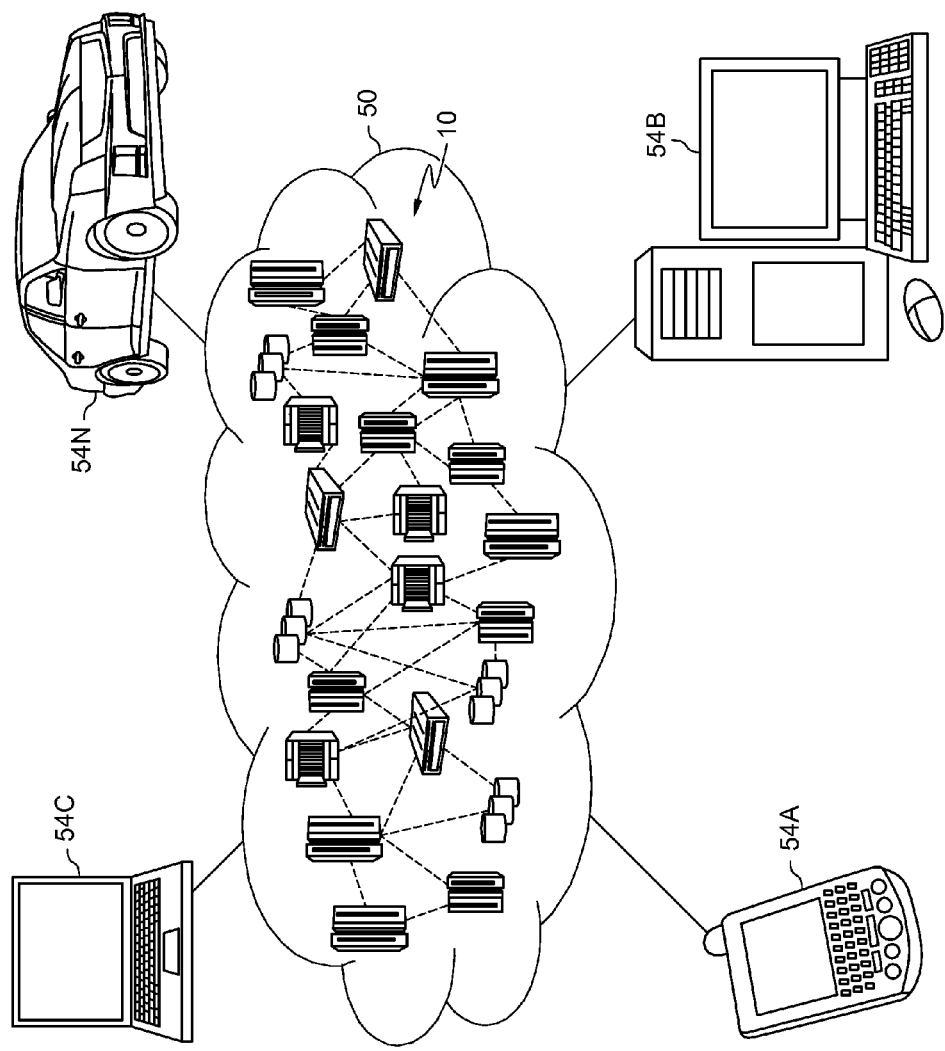
FIG. 5 depicts a cloud computing environment according to an embodiment of the present invention.

Referring now to FIG. 5, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 10 and cloud computing environment 50 can communicate with any type of computerized device over any type of network and/or network addressable connection (e.g., using a web browser).

Figure 6:
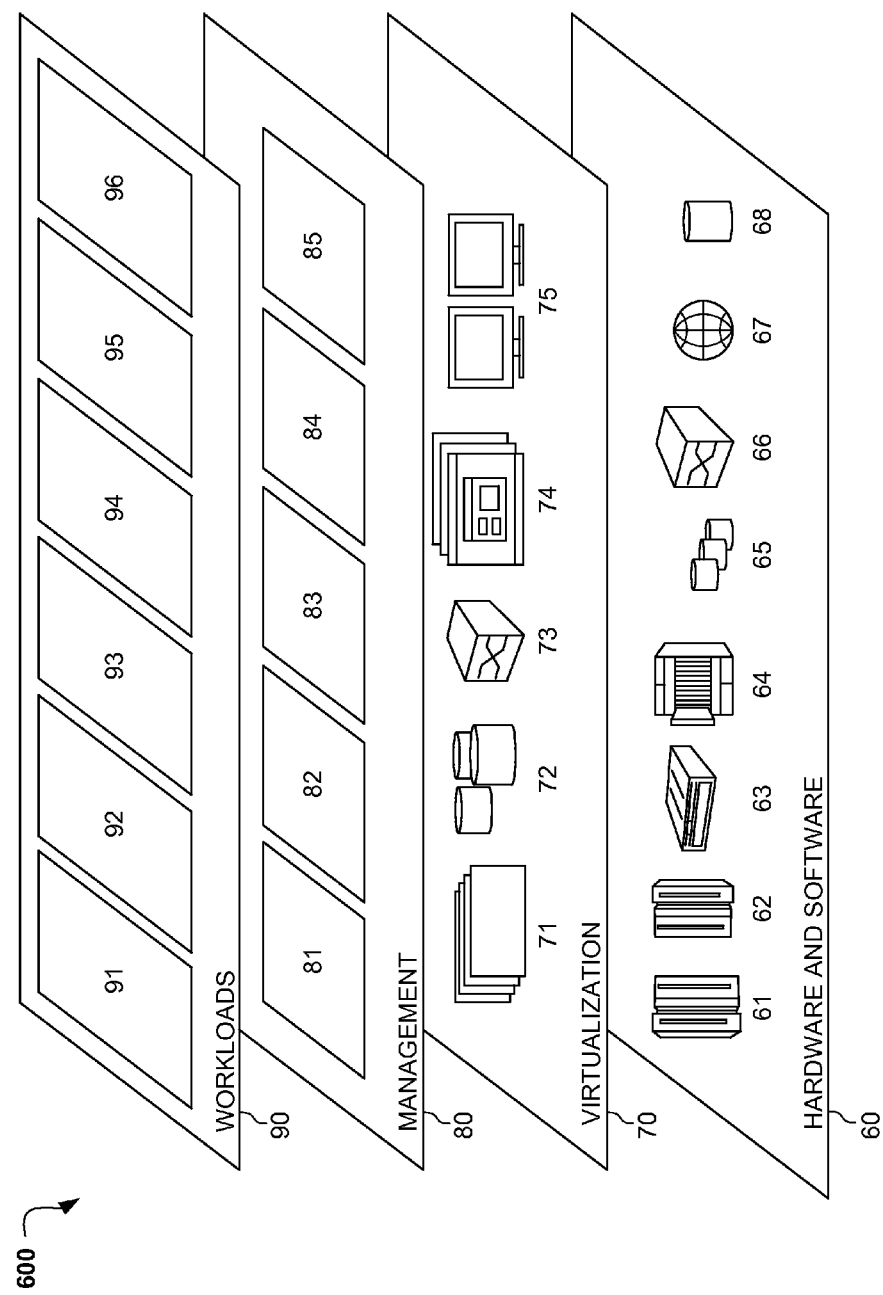
FIG. 6 depicts abstraction model layers according to an embodiment of the present invention.

Referring now to FIG. 6, a set of functional abstraction layers 600 provided by cloud computing environment 50 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and lossy data compression 96. Lossy data compression 96 may refer to reducing the number of bits in a data message through identification and removal of unnecessary information.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A processor-implemented method for lossy data compression, the method comprising:
   receiving, by a processor, a data message from a sender;
   determining a length and a plurality of bounding characters associated with each data item within the received data message;
   encoding each data item within the received data message by replacing each data item with the determined length and the determined plurality of bounding characters; and
   transmitting the received data message to a recipient.

2. The method of claim 1, wherein the plurality of bounding characters associated with each data item includes at least one of a first character of the data item and a last character of the data item.

3. The method of claim 1, wherein reconstructing the transmitted data message further comprises:
   creating a list of unencoded candidate data items based on the determined length and the determined plurality of bounding characters associated with an encoded data item;
   determining an unencoded data item on the list of unencoded candidate data items that corresponds to the encoded data item within the transmitted data message; and
   replacing the encoded data item with the determined unencoded data item.

4. The method of claim 3, wherein determining an unencoded data item includes at least one of implementing natural language algorithms to determine the unencoded data item and implementing user selection of the unencoded data item from the list of unencoded candidate data items.

5. The method of claim 1, wherein reconstructing the transmitted data message includes implementing a dialogue system.

6. The method of claim 1, wherein transmitting the received data message to a recipient includes establishing a handshake between the sender and the recipient.

7. The method of claim 1, further comprising:
   performing entropy encoding on each encoded data item within the received data message.

8. The method of claim 1, further comprising:
   reconstructing the transmitted data message.

9. A computer system for lossy data compression, the computer system comprising:
   one or more processors, one or more computer-readable memories, one or more computer-readable tangible storage medium, and program instructions stored on at least one of the one or more tangible storage medium for execution by at least one of the one or more processors via at least one of the one or more memories, wherein the computer system is capable of performing a method comprising:
   receiving a data message from a sender;
   determining a length and a plurality of bounding characters associated with each data item within the received data message;
   encoding each data item within the received data message by replacing each data item with the determined length and the determined plurality of bounding characters; and
   transmitting the received data message to a recipient.

10. The computer system of claim 9, wherein the plurality of bounding characters associated with each data item includes at least one of a first character of the data item and a last character of the data item.

11. The computer system of claim 9, wherein reconstructing the transmitted data message further comprises:
   creating a list of unencoded candidate data items based on the determined length and the determined plurality of bounding characters associated with an encoded data item;
   determining an unencoded data item on the list of unencoded candidate data items that corresponds to the encoded data item within the transmitted data message; and
   replacing the encoded data item with the determined unencoded data item.

12. The computer system of claim 11, wherein determining an unencoded data item includes at least one of implementing natural language algorithms to determine the unencoded data item and implementing user selection of the unencoded data item from the list of unencoded candidate data items.

13. The computer system of claim 9, wherein reconstructing the transmitted data message includes implementing a dialogue system.

14. The computer system of claim 9, wherein transmitting the received data message to a recipient includes establishing a handshake between the sender and the recipient.

15. The computer system of claim 9, further comprising:
   performing entropy encoding on each encoded data item within the received data message.

16. The computer system of claim 9, further comprising:
   reconstructing the transmitted data message.

17. A computer program product for lossy data compression, the computer program product comprising:
   one or more computer-readable tangible storage medium and program instructions stored on at least one of the one or more tangible storage medium, the program instructions executable by a processor, the program instructions comprising:
   program instructions to receive a data message from a sender;
   program instructions to determine a length and a plurality of bounding characters associated with each data item within the received data message;
   program instructions to encode each data item within the received data message by replacing each data item with the determined length and the determined plurality of bounding characters; and
   program instructions to transmit the received data message to a recipient.

18. The computer program product of claim 17, wherein the plurality of bounding characters associated with each data item includes at least one of a first character of the data item and a last character of the data item.

19. The computer program product of claim 17, wherein reconstructing the transmitted data message further comprises:
   program instructions to create a list of unencoded candidate data items based on the determined length and the determined plurality of bounding characters associated with an encoded data item;
   program instructions to determine an unencoded data item on the list of unencoded candidate data items that corresponds to the encoded data item within the transmitted data message; and program instructions to replace the encoded data item with the determined unencoded data item.

20. The computer program product of claim 19, wherein determining an unencoded data item includes at least one of implementing natural language algorithms to determine the unencoded data item and implementing user selection of the unencoded data item from the list of unencoded candidate data items.

\* \* \* \* \*